United States Patent
Leisen et al.

(10) Patent No.: US 11,211,524 B2
(45) Date of Patent: Dec. 28, 2021

(54) METHOD OF PRODUCING AN OPTOELECTRONIC COMPONENT

(71) Applicant: OSRAM OLED GmbH, Regensburg (DE)

(72) Inventors: Daniel Leisen, Regensburg (DE); Herbert Brunner, Sinzing (DE); Emilia Dinu, Regensburg (DE); Jens Eberhard, Lemgo (DE); Christina Keith, Neutraubling (DE); Markus Pindl, Tegernheim (DE); Thomas Reeswinkel, Regensburg (DE); Daniel Richter, Bad Abbach (DE)

(73) Assignee: OSRAM OLED GmbH, Regensburg (DE)

( * ) Notice: Subject to any disclaimer, the term of this patent is extended or adjusted under 35 U.S.C. 154(b) by 132 days.

(21) Appl. No.: 16/631,294

(22) PCT Filed: Jul. 31, 2018

(86) PCT No.: PCT/EP2018/070757
§ 371 (c)(1),
(2) Date: Jan. 15, 2020

(87) PCT Pub. No.: WO2019/025451
PCT Pub. Date: Feb. 7, 2019

(65) Prior Publication Data
US 2021/0126156 A1    Apr. 29, 2021

(30) Foreign Application Priority Data
Aug. 1, 2017    (DE) .................... 10 2017 117 425.7

(51) Int. Cl.
*H01L 33/00*    (2010.01)
*H01L 31/18*    (2006.01)
(Continued)

(52) U.S. Cl.
CPC ........ *H01L 33/0095* (2013.01); *H01L 31/186* (2013.01); *H01L 33/507* (2013.01);
(Continued)

(58) Field of Classification Search
CPC ......... H01L 33/0095; H01L 2933/0033; H01L 2933/0041; H01L 2933/005;
(Continued)

(56) References Cited

U.S. PATENT DOCUMENTS 2,706,262 A * 4/1955 Robert .................. G02B 1/113
                                                  313/478
7,180,240 B2 * 2/2007 Noguchi ............... H01L 33/486
                                                  257/100
(Continued)

FOREIGN PATENT DOCUMENTS

EP    1 174 931 A2    1/2002
JP    2014-120550 A    6/2014
(Continued)

*Primary Examiner* — Scott B Geyer
(74) *Attorney, Agent, or Firm* — DLA Piper LLP (US)

(57) ABSTRACT

A method of manufacturing an optoelectronic component includes providing a carrier with an upper side; arranging an optoelectronic semiconductor chip above the upper side of the carrier; arranging a casting material above the upper side of the carrier, wherein the optoelectronic semiconductor chip is embedded in the casting material, and the casting material forms a cast surface; simultaneously spraying particles and a further material onto the cast surface, wherein a mixture of the further material and the particles includes a proportion of the particles of 20 percent by weight to 60 percent by weight, a portion of the particles remains at the cast surface, and a topography is created at the cast surface.

8 Claims, 2 Drawing Sheets

(51) Int. Cl.
*H01L 33/50* (2010.01)
*H01L 33/54* (2010.01)

(52) U.S. Cl.
CPC ........ *H01L 33/54* (2013.01); *H01L 2933/005* (2013.01); *H01L 2933/0041* (2013.01); *H01L 2933/0091* (2013.01)

(58) Field of Classification Search
CPC ........... H01L 2933/0091; H01L 33/486; H01L 33/502; H01L 33/505; H01L 33/507; H01L 33/508; H01L 33/52; H01L 33/54; H01L 33/56; H01L 23/3107; H01L 23/3121
See application file for complete search history.

(56) References Cited

U.S. PATENT DOCUMENTS

| | | | |
|---|---|---|---|
| 8,294,165 B2 * | 10/2012 | Hattori | H01L 33/505 257/98 |
| 8,378,366 B2 * | 2/2013 | Arndt | H01L 33/486 257/98 |
| 9,103,525 B2 * | 8/2015 | Huang | G02B 19/0014 |
| 9,231,175 B2 | 1/2016 | Sato | |
| 9,461,217 B2 | 10/2016 | Chan et al. | |
| 2005/0133808 A1 * | 6/2005 | Uraya | H01L 33/486 257/99 |
| 2008/0030986 A1 | 2/2008 | Ogawa et al. | |
| 2008/0076198 A1 | 3/2008 | Park et al. | |
| 2009/0146171 A1 | 6/2009 | Okubo | |
| 2014/0284652 A1 | 9/2014 | Shimada et al. | |
| 2014/0306244 A1 | 10/2014 | Oraw et al. | |
| 2014/0333199 A1 | 11/2014 | Wang et al. | |
| 2017/0018687 A1 * | 1/2017 | West | H01L 33/502 |
| 2017/0207372 A1 | 7/2017 | Hawtof et al. | |

FOREIGN PATENT DOCUMENTS

| | | |
|---|---|---|
| WO | 2011/144385 A1 | 11/2011 |
| WO | 2016/119863 A1 | 8/2016 |

* cited by examiner

METHOD OF PRODUCING AN OPTOELECTRONIC COMPONENT

TECHNICAL FIELD

This disclosure relates to a method of manufacturing an optoelectronic component.

BACKGROUND

Optoelectronic components with optoelectronic semiconductor chips embedded in a casting material are known. The casting material can comprise volume-scattering particles that can be provided to scatter electromagnetic radiation arriving from outside diffusely. This can, for example, reduce the gloss on a lead frame at which an optoelectronic semiconductor chip can be disposed.

Optoelectronic components whose casting material has a roughened cast surface are also known.

There is nonetheless a need to provide an improved method of manufacturing an optoelectronic component.

SUMMARY

We provide a method of manufacturing an optoelectronic component including providing a carrier with an upper side; arranging an optoelectronic semiconductor chip above the upper side of the carrier; arranging a casting material above the upper side of the carrier, wherein the optoelectronic semiconductor chip is embedded in the casting material, and the casting material forms a cast surface; simultaneously spraying particles and a further material onto the cast surface, wherein a mixture of the further material and the particles includes a proportion of the particles of 20 percent by weight to 60 percent by weight, a portion of the particles remains at the cast surface, and a topography is created at the cast surface.

LIST OF REFERENCE SIGNS

Figure 1:
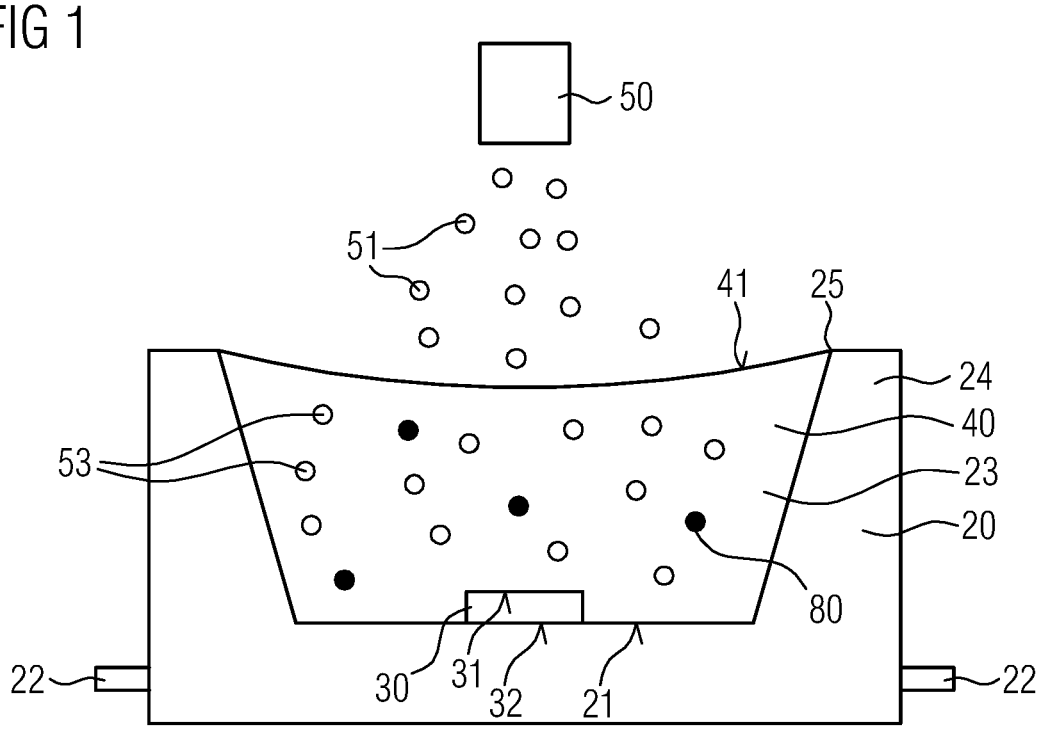
FIG. 1 schematically shows a side view of a housing body with a cavity and a casting material disposed therein, wherein particles are sprayed onto a cast surface.

10 Optoelectronic component
11 Variant of the optoelectronic component
20 Carrier
21 Upper side of the carrier
22 Electrical terminal for an optoelectronic semiconductor chip
23 Cavity
24 Wall
25 Upper edge of the wall
30 Optoelectronic semiconductor chip
31 Upper side of the optoelectronic semiconductor chip
32 Lower side of the optoelectronic semiconductor chip
40 Casting material
41 Cast surface
50 Spray head
51 Particles
52 Average diameter of the particles
53 Further particles
60 Matrix material
61 Thickness of the matrix material
70 Further material
71 Thickness of the further material
80 Wavelength-converting fluorescent material

DETAILED DESCRIPTION

Our method of manufacturing an optoelectronic component has the following method steps. A carrier with an upper side is provided. An optoelectronic semiconductor chip is arranged above the upper side of the carrier. A casting material is further arranged above the upper side of the carrier, while the optoelectronic semiconductor chip is embedded in the casting material. The casting material forms a cast surface. Particles are sprayed onto the cast surface, wherein a portion of the particles remains at the cast surface, and a topography is created at the cast surface. The topography that is created through spraying the particles onto the cast surface offers the advantage that electromagnetic radiation arriving from outside can be scattered diffusely at the cast surface. A specular reflection of the electromagnetic radiation at the cast surface can thereby be suppressed. In this way it is possible to achieve a reduction in or to eliminate the gloss of the cast surface. This can, for example, be significant for display screens that can comprise a plurality of optoelectronic components and that are set up in a bright environment. A suppressed specular reflection at the cast surface can, for example, enable elements in particular whose display is to be dark or black to be displayed without gloss effects. The method of manufacturing the optoelectronic component offers the advantage that such a topography of the cast surface can be created in a simple manner, namely through spraying on the particles.

A substance may be introduced into the casting material before spraying on the particles. The substance may be configured to prevent the particles to be sprayed onto the cast surface from sinking into the casting material. This can, for example, be achieved through an increase in the viscosity of the casting material as a result of the introduction of the substance. Advantageously, if the casting material comprises a substance configured to increase the viscosity of the casting material, particles sprayed onto the cast surface rather can remain at the cast surface. The substance can, for example, be a gas introduced into the casting material.

The casting material may be partially hardened before spraying on the particles. Sinking of the particles sprayed onto the cast surface into the casting material may thereby be advantageously prevented.

The casting material may be hardened after spraying on the particles. Particles sprayed onto the cast surface are thereby advantageously permanently fixed to the cast surface.

Particles that are unbonded or weakly bonded at the cast surface after the particles have been sprayed on may be removed. Advantageously, only permanently fixed particles thereby remain at the cast surface. Particles that are unbonded or weakly bonded that could detach from the cast surface over time are removed so that the property of the cast surface of scattering incoming electromagnetic radiation diffusely is retained without particles that detach from the cast surface over time changing the topography developed at the cast surface.

After spraying the particles on, a matrix material may be disposed at the cast surface, whereby the particles may be embedded in the matrix material. Advantageously, even unbonded particles may be fixed to the cast surface by the matrix material so that removal of unbonded or weakly bonded particles can be omitted.

A further material may be sprayed on simultaneously with the particles. Advantageously, particles sprayed onto the cast surface together with the further material are bonded to the cast surface from the beginning. One further advantage is that the further material does not have to be disposed in an additional method step.

A thickness of the matrix material after disposal of the matrix material, or a thickness of the further material after spraying the further material onto the cast surface, may be smaller than an average diameter of the particles. The topography developed at the cast surface can advantageously remain, and thus also the property of the cast surface to scatter incoming electromagnetic radiation diffusely may be retained if the thickness of the matrix material or the thickness of the further material is smaller than the average diameter of the particles.

The casting material may comprise further particles. Advantageously, the further particles can be provided to scatter the incoming electromagnetic radiation diffusely in the casting material. This can suppress a gloss at other components of the optoelectronic component. The further particles can, for example, be provided to reduce the gloss at a lead frame, wherein the optoelectronic semiconductor chip can be disposed at the lead frame. The further particles can furthermore be provided to adjust a coefficient of thermal expansion of the casting material. It is, for example, possible that the carrier and the casting material have coefficients of thermal expansion that differ such that a thermal stress, for example, during operation of the optoelectronic component, would lead to damage to the optoelectronic component. A thermal stress could, for example, have the effect of a delamination of the casting material from the carrier, whereby, for example, moisture could penetrate into the optoelectronic component. The further particles can be configured to prevent such effects.

The casting material may comprise a wavelength-converting fluorescent material. The wavelength-converting fluorescent material may be advantageously configured to modify a wavelength of electromagnetic radiation that can be emitted from the optoelectronic semiconductor chip in that the wavelength-converting fluorescent material absorbs the electromagnetic radiation emitted from the optoelectronic semiconductor chip and thereupon emits electromagnetic radiation with a different wavelength. It is, for example, possible that the optoelectronic semiconductor chip is designed to emit blue light, while the wavelength-converting fluorescent material embedded in the casting material is configured to absorb the blue light and, for example, to emit yellow light. In this example, the optoelectronic component can radiate in total light giving a white color impression.

The above-described properties, features and advantages, and the manner in which they are achieved, are clearer and significantly more comprehensible in connection with the following description of examples, which will be explained in more detail in connection with the drawings.

FIG. 1 shows a diagram of a variant of a method of manufacture of an optoelectronic component 10.

A carrier 20 with an upper side 21 is prepared. In the example shown in FIG. 1, the carrier 20 is formed as a housing body. The carrier 20, configured as a housing body, comprises a cavity 23 that is enclosed laterally by a wall 24. This is not, however, an essential requirement. The carrier 20 can also be a flat substrate so that the cavity 23 and the wall 24 can be omitted. Only that variant of the carrier 20 in which the carrier 20 is formed as a housing body is shown by way of example in FIGS. 1 to 4.

If the carrier 20 is formed as a housing body, it can comprise a plastic, for example, a polyphthalamide (PPA). The carrier 20 can, for example, be manufactured using a molding method, for example, an injection molding method. If the carrier 20 is a flat substrate, the carrier 20 can, for example, be a metal substrate, a semiconductor substrate, a semiconductor oxide substrate, a ceramic substrate, a glass substrate or a printed circuit board (PCB).

An optoelectronic semiconductor chip 30 is disposed above the upper side 21 of the carrier 20. The optoelectronic semiconductor chip 30 comprises an upper side 31 and a lower side 32 opposite the upper side 31. The optoelectronic semiconductor chip 30 is disposed with its lower side 32 above the upper side 21 of the carrier 20.

The optoelectronic semiconductor chip 30 can, for example, be designed to emit electromagnetic radiation at its upper side 31. The optoelectronic semiconductor chip 30 can, however, also be designed to detect electromagnetic radiation arriving at the upper side 31. The optoelectronic semiconductor chip 30 can thus, for example, be a light-emitting diode chip or a photodiode chip.

To supply the optoelectronic semiconductor chip 30 with electrical energy for operation, the carrier 20 comprises laterally protruding electrical terminals 22. The electrical terminals 22 can, for example, be part of a metal lead frame that can be embedded in the carrier 20 formed as a housing body. A lead frame typically comprises a first and a second lead frame segment, wherein the lead frame segments are exposed at the upper side 21 of the carrier 20 (not illustrated in FIG. 1). The optoelectronic semiconductor chip 30 can be disposed at the first segment of the lead frame, wherein the optoelectronic semiconductor chip 30 can be connected to the second segment of the lead frame by a bond wire. In this example, the optoelectronic semiconductor chip 30 comprises a contact surface at its upper side 31 and a further contact surface at its lower side 32.

An optoelectronic semiconductor chip 30 is disposed above the upper side 21 of the carrier 20 in the illustrations of FIGS. 1 to 4. A plurality of optoelectronic semiconductor chips 30 can, however, also be disposed above the upper side 21 of the carrier 20. Three optoelectronic semiconductor chips 30 can, for example, be disposed above the upper side 21 of the carrier 20. The three optoelectronic semiconductor chips 30 can, for example, be designed to emit electromagnetic radiation of different wavelengths. The three optoelectronic semiconductor chips 30 can, for example, form an RGB pixel. In this example, the optoelectronic semiconductor chips 30 emit red, green and blue light.

A casting material 40 is disposed above the upper side 21 of the carrier 20. In the illustrated example of FIG. 1 the casting material 40 is disposed in the cavity 23. Since the carrier 20 does not necessarily have to be formed as a housing body, the casting material 40 also does not necessarily have to be disposed in a cavity 23. If the carrier 20 is formed, for example, as a flat substrate, the casting material 40 can be disposed above the upper side 21 of the carrier 20 such that the casting material 40 forms, for example, a lens. The casting material 40 forms a cast surface 41 in both examples.

The casting material 40 has been disposed up to an upper edge 25 of the wall 24 in the cavity 23 in the illustrations of FIGS. 1 to 4. This is also not an essential requirement. When the carrier 20 is formed as a housing body, a plurality of casting materials 40 can also be disposed in layers in the cavity 23.

The casting material 40 can comprise a plastic, for example, an epoxide or a silicone. The casting material 40 can, for example, be disposed above the upper side 21 of the carrier 20 by a dosing method.

To suppress a specular reflection of incoming electromagnetic radiation at the cast surface 41, particles 51 are sprayed onto the cast surface 41. The spraying of the particles 51 onto the cast surface 41 is suggested in FIG. 1 by a spray head 50 arranged opposite the cast surface 41. Through the spraying of the particles 51 onto the cast surface 41, a portion of the particles 51 remains at the cast surface 41, and creates a topography at the cast surface 41. The topography created at the cast surface 41 can be configured to scatter incoming electromagnetic radiation diffusely so that a specular reflection of electromagnetic radiation, i.e., a gloss of the cast surface 41, can be suppressed or entirely eliminated.

The particles 51 can, for example, comprise silicon dioxide or titanium dioxide. The particles 51 can comprise a spherical form corresponding to the illustration of FIG. 1. This is not, however, an essential requirement. The particles 51 can also have another form, for example, a flocculent form. The particles 51 sprayed onto the cast surface 41 can, for example, comprise an average diameter 52 of 0.5 µm to 50 µm. Deviations from the average diameter 52 are possible.

To prevent the particles 51 sprayed onto the cast surface 41 from sinking, a substance that can increase the viscosity of the casting material 40 can be introduced into the casting material 40 before spraying on the particles 51. The substance can, for example, comprise an inert gas such as nitrogen. The gas can, for example, be present dispersed in the casting material 40 through gas injection. The substance can however also be a liquid or a solid. Alternatively the casting material 40 can be partially hardened before spraying on the particles 51 to prevent sinking of the particles 51 sprayed onto the cast surface 41.

So that the particles 51 sprayed onto the cast surface 41 can be bonded to the cast surface 41, the casting material 40 can be hardened after spraying on the particles 51. The casting material 40 can, for example, be hardened thermally or through UV irradiation.

Particles 51 that can potentially be present at the cast surface 41 in an unbonded or weakly bonded manner can be removed from the cast surface 41 after hardening the casting material 40. This can, for example, be done by an air current. Alternatively, the unbonded particles 51 at the cast surface 41 can also be removed in a fluid medium.

It is possible that the particles 51 are sprayed both onto the cast surface 41 and onto the plastic that forms the housing body. In this example, a surface of the housing body can also comprise sprayed-on particles 51, whereby the housing body can also diffusely scatter incoming electromagnetic radiation. In addition, a masking is also possible which allows particles 51 to be sprayed selectively either onto the cast surface 41 or onto the surface of the housing body, wherein side walls of the housing body can also comprise sprayed-on particles 51.

Figure 2:
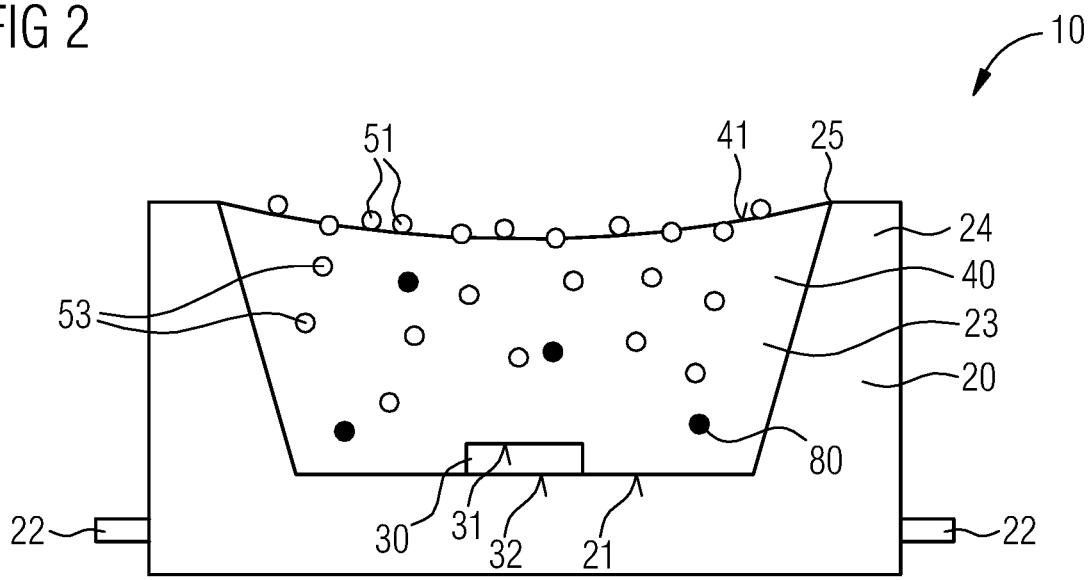
FIG. 2 schematically shows a side view of an optoelectronic component.

FIG. 2 shows a schematic side view of an optoelectronic component 10 that has been manufactured by the spraying on of the particles 51 as shown in FIG. 1.

In addition to the particles 51 sprayed onto the cast surface 41, the optoelectronic component 10 can also comprise further particles 53. The further particles 53 are embedded in the casting material 40. The further particles 53 can also, for example, comprise silicon dioxide or titanium dioxide. An average diameter of the further particles 53 can, for example, be 1 µm to 30 µm. Deviations from the average diameter are possible. A casting compound of the casting material 40 and the further particles 53 can, for example, comprise a proportion of the further particles 53 of 15 percent by weight to 30 percent by weight.

The further particles 53 can, for example, be provided to scatter incoming electromagnetic radiation diffusely within the casting material 40. It is possible in this way, for example, to ensure that a gloss at a lead frame is prevented. The further particles 53 can furthermore bring about an adjustment of the coefficients of thermal expansion of the casting material 40. The further particles 53 can however also be omitted.

The optoelectronic component 10 can, furthermore, comprise a wavelength-converting fluorescent material 80 embedded in the casting material 40. The wavelength-converting fluorescent material 80 is configured to convert a wavelength of electromagnetic radiation emitted from the optoelectronic semiconductor chip 30. The wavelength-converting fluorescent material 80 can, for example, be present in the form of particles. Particles that as a consequence of an absorption of electromagnetic radiation from a first spectral region emit electromagnetic radiation from a different spectral region come into consideration. The wavelength-converting fluorescent material 80 can, for example, comprise a garnet fluorescent material doped with rare earths, for example, an yttrium-aluminum garnet doped with cerium ions (Ce:YAG) which is typically configured to generate a larger wavelength through fluorescence. The wavelength-converting fluorescent material 80 can also however be omitted.

Figure 3:
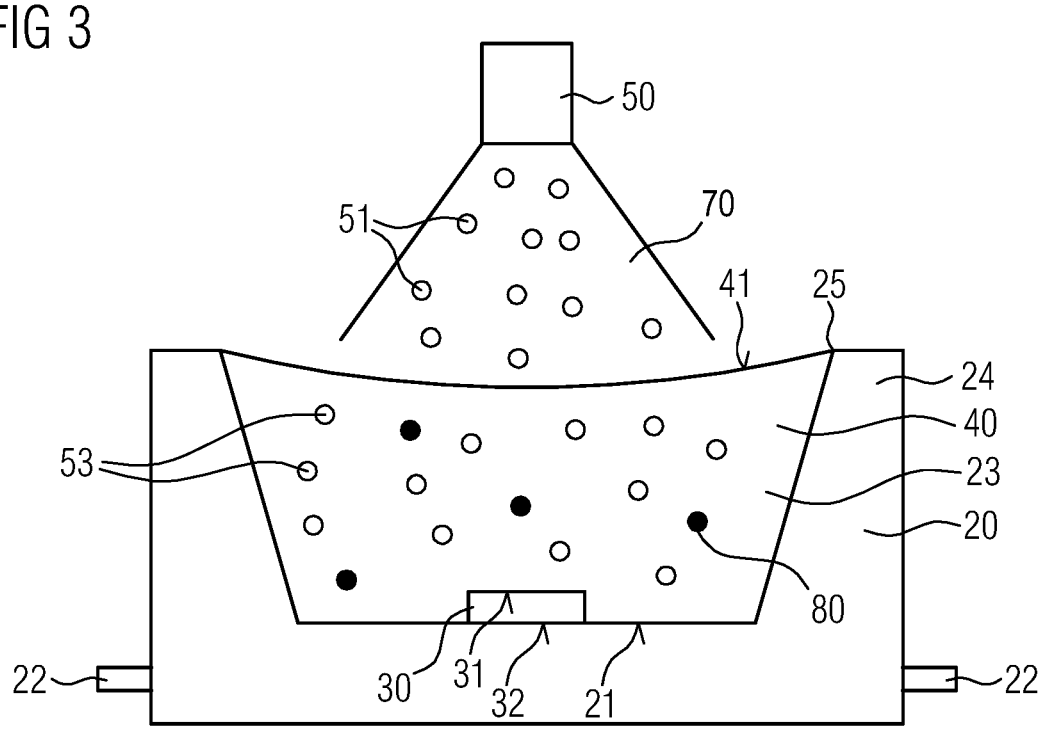
FIG. 3 schematically shows a side view of a housing body with a cavity and a casting material disposed therein, wherein particles are sprayed onto a cast surface together with a further material.
Figure 4:
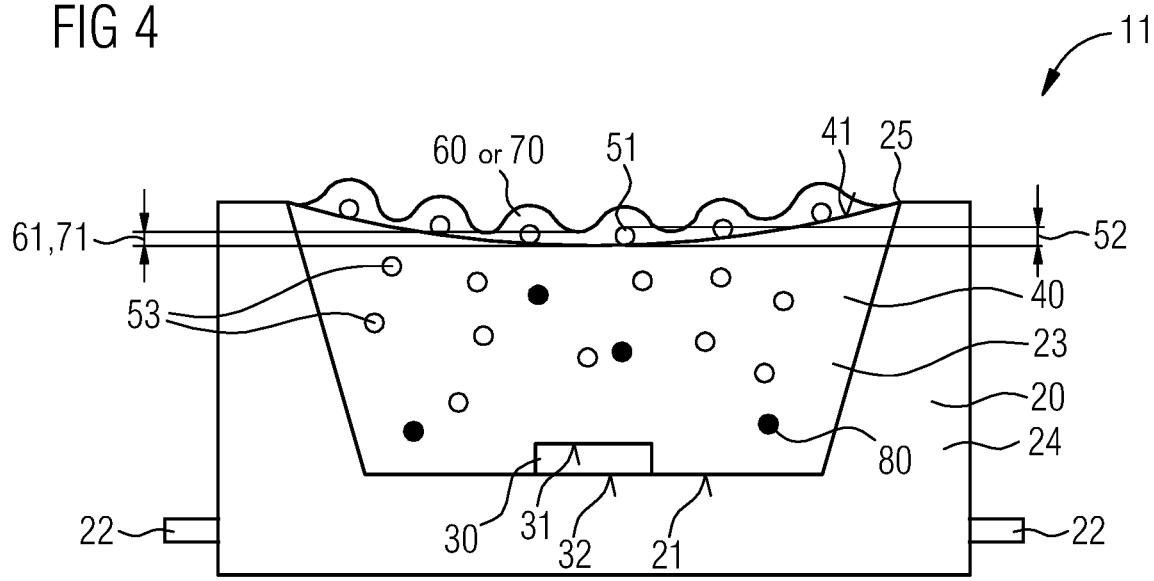

FIG. 3 shows a diagram of a variant of the method of manufacturing an optoelectronic component 11. FIG. 4 shows a schematic side view of the optoelectronic component 11 manufactured according to the method. The method has great similarities to the method shown in FIG. 1. The optoelectronic component 11 also has a great similarity to the optoelectronic component 10 shown in FIG. 2. The same elements are indicated with the identical reference signs in what follows. The differences of the method and the optoelectronic components 10, 11 are primarily indicated in what follows.

Unlike the method indicated in FIG. 1, in the variant shown in FIG. 3, the particles 51 are sprayed on simultaneously with a further material 70. This method offers the advantage that a majority of the particles 51 sprayed onto the cast surface 41 are bonded to the cast surface 41 immediately. A mixture of the further material 70 and the particles 51 can, for example, comprise a proportion of the particles 51 of 20 percent by weight to 60 percent by weight.

The further material 70 can also comprise a plastic, for example, an epoxide or a silicone. The further material 70 can also be identical to the casting material 40.

In a further variant of the method, a matrix material 60 is disposed at the cast surface 41 after spraying on the particles 51. In this example too, the particles 51 are embedded in the matrix material 60 and fixed to the cast surface 41.

The matrix material 60 can also comprise a plastic, for example, an epoxide or a silicone. The matrix material 60 can also have the same composition as the further material 70. In particular, the casting material 40, the further material 70, and the matrix material 60 can have the same composition.

So that the topography created by the particles 51 sprayed onto the cast surface 41 remains, it is expedient for a thickness 61 of the matrix material 60 after the disposal of the matrix material 60, or a thickness 71 of the further material 70 after spraying the further material onto the cast surface 41, to be smaller than the average diameter 52 of the particles 51.

Both the optoelectronic component 10 shown in FIG. 2 and the optoelectronic component 11 shown in FIG. 3 are configured to scatter incoming electromagnetic radiation diffusely at the cast surface 41. As a result, a specular reflection of electromagnetic radiation arriving at the cast surface 41 is suppressed.

Aside from the fact that the particles 51 sprayed onto the cast surface 41 create a topography at the cast surface 41 that is configured to scatter electromagnetic radiation arriving from outside diffusely, the topography created at the cast surface 41 can also increase an extraction efficiency of the optoelectronic component 10, 11. The particles 51 sprayed onto the cast surface 41 can namely suppress a total internal reflection of the electromagnetic radiation emitted by the optoelectronic semiconductor chip 30 at an inner side of the cast surface 41. A greater proportion of the electromagnetic radiation emitted by the optoelectronic semiconductor chip 30 can thereby emerge from the optoelectronic component 10, 11 at the cast surface 41.

The method of manufacturing an optoelectronic component 10, 11 is not restricted to the individual optoelectronic components 10, 11. A two-dimensional composite of a plurality of optoelectronic components 10, 11, for example, an LED array, with particles 51 simultaneously sprayed onto a plurality of cast surfaces 41 can also, for example, be provided. Individual optoelectronic components 10, 11 can also be manufactured by isolating the composite. As a result, the particles 51 do not have to be sprayed onto each individual optoelectronic component 10, 11.

Our methods and components have been illustrated and described in more detail with reference to preferred examples. This disclosure is not, however, limited to the disclosed examples. Rather, different variations can be derived from this by those skilled in the art without departing the scope of protection of the appended claims.

This application claims priority of DE 10 2017 117 425.7, the subject matter of which is incorporated herein by reference.

The invention claimed is:

1. A method of manufacturing an optoelectronic component comprising:
    providing a carrier with an upper side;
    arranging an optoelectronic semiconductor chip above the upper side of the carrier;
    arranging a casting material above the upper side of the carrier, wherein the optoelectronic semiconductor chip is embedded in the casting material, and the casting material forms a cast surface;
    simultaneously spraying particles and a further material onto the cast surface, wherein a mixture of the further material and the particles comprises a proportion of the particles of 20 percent by weight to 60 percent by weight, a portion of the particles remains at the cast surface, and a topography is created at the cast surface.

2. The method as claimed in claim 1, further comprising, before spraying on the particles, introducing a substance into the casting material, wherein the substance is configured to prevent the particles to be sprayed onto the cast surface from sinking into the casting material.

3. The method as claimed in claim 1, further comprising, before spraying on the particles, partially hardening the casting material.

4. The method as claimed in claim 1, further comprising, after spraying on the particles, hardening the casting material.

5. The method as claimed in claim 1, further comprising, after spraying on the particles, removing unbonded or weakly bonded particles at the cast surface.

6. The method as claimed in claim 1, wherein a thickness of the further material after spraying the further material onto the cast surface is smaller than an average diameter of the particles.

7. The method as claimed in claim 1, wherein the casting material comprises further particles.

8. The method as claimed in claim 1, wherein the casting material comprises a wavelength-converting fluorescent material.

* * * * *